(12) United States Patent
Minton et al.

(10) Patent No.: US 12,311,634 B2
(45) Date of Patent: May 27, 2025

(54) ATOMIC OXYGEN-RESISTANT, LOW DRAG COATINGS AND MATERIALS

(71) Applicant: Skeyeon, Inc., San Diego, CA (US)

(72) Inventors: Timothy K. Minton, San Diego, CA (US); Thomas E. Schwartzentruber, San Diego, CA (US)

(73) Assignee: Skeyeon, Inc., San Diego, CA (US)

( * ) Notice: Subject to any disclaimer, the term of this patent is extended or adjusted under 35 U.S.C. 154(b) by 0 days.

(21) Appl. No.: 18/114,547

(22) Filed: Feb. 27, 2023

(65) Prior Publication Data

US 2023/0241866 A1 Aug. 3, 2023

Related U.S. Application Data

(63) Continuation of application No. 16/811,869, filed on Mar. 6, 2020, now abandoned, which is a continuation of application No. 15/881,417, filed on Jan. 26, 2018, now Pat. No. 10,583,632.

(60) Provisional application No. 62/616,325, filed on Jan. 11, 2018.

(51) Int. Cl.
| | |
|---|---|
| *B32B 15/08* | (2006.01) |
| *B32B 15/088* | (2006.01) |
| *B64G 1/10* | (2006.01) |
| *C08K 3/34* | (2006.01) |
| *C09D 5/00* | (2006.01) |
| *C09D 143/04* | (2006.01) |

(Continued)

(52) U.S. Cl.
CPC ............... *B32B 15/088* (2013.01); *B64G 1/10* (2013.01); *C08K 3/34* (2013.01); *C09D 5/00* (2013.01); *C09D 143/04* (2013.01); *C23C 16/45525* (2013.01); *C08K 2003/2227* (2013.01); *C08K 2003/2231* (2013.01); *C08K 2003/2241* (2013.01); *C08K 2003/2244* (2013.01); *C08K 2003/2296* (2013.01)

(58) Field of Classification Search
CPC ......... B32B 15/088; B32B 15/20; C09D 5/00; B64G 1/226; B64G 1/10; B64G 2001/1092

See application file for complete search history.

(56) References Cited

U.S. PATENT DOCUMENTS

| | | | | |
|---|---|---|---|---|
| 3,871,902 A | * | 3/1975 | Leinkram | C23D 5/00 136/246 |
| 4,664,980 A | | 5/1987 | Sovey et al. | |

(Continued)

FOREIGN PATENT DOCUMENTS

CN 102673772 A 9/2012

OTHER PUBLICATIONS

European Patent Office, Office Communication, Application No. 19738639.4, dated Oct. 4, 2021, 10 pages.

(Continued)

*Primary Examiner* — Michael H Wang
(74) *Attorney, Agent, or Firm* — McAndrews, Held & Malloy, Ltd.

(57) ABSTRACT

Coatings and materials that are atomic oxygen resistant and have an atomically smooth surface that can reduce drag are disclosed. The coatings and materials can be used on at least a portion of a spacecraft intended to operate in harsh environments, such as stable Earth orbits at about 100 km to about 350 km.

18 Claims, 6 Drawing Sheets

(51) Int. Cl.
*C23C 16/455* (2006.01)
*C08K 3/22* (2006.01)

(56) References Cited

U.S. PATENT DOCUMENTS

| | | | | |
|---|---|---|---|---|
| 4,939,031 A * | 7/1990 | Torre | ............... | G02B 1/14 |
| | | | | 428/912.2 |
| 4,980,206 A * | 12/1990 | Torre | ............... | C08K 3/013 |
| | | | | 244/172.3 |
| 5,498,760 A * | 3/1996 | Piketty-Leydier | ...... | C04B 41/89 |
| | | | | 427/454 |
| 5,790,304 A | 8/1998 | Sanders et al. | | |
| 2002/0032115 A1* | 3/2002 | Oguri | ............... | C03C 14/004 |
| | | | | 501/32 |
| 2003/0141417 A1* | 7/2003 | Cordaro | ............... | B64G 1/226 |
| | | | | 244/171.7 |
| 2006/0279679 A1* | 12/2006 | Fujisawa | ............... | G02B 5/0242 |
| | | | | 349/116 |
| 2009/0196986 A1* | 8/2009 | Cordaro | ............... | B64G 1/226 |
| | | | | 427/126.3 |
| 2010/0056666 A1* | 3/2010 | Poe | ............... | C08L 79/08 |
| | | | | 523/135 |
| 2012/0193015 A1* | 8/2012 | Segal | ............... | H01Q 1/288 |
| | | | | 156/60 |
| 2018/0155067 A1* | 6/2018 | Reedy | ............... | F03H 1/0012 |

OTHER PUBLICATIONS

Bernasek S., L. et al.; "Molecular beam scattering from solid surfaces," Progress in Surface Science, Oxford, GB, vol. 5, Jan. 1, 1975, pp. 377-439, XP024447324, ISSN: 0079-6816, DOI: 10.1016/0079-6816(75)9 0001-5, retrieved on Jan. 1, 1975.
Europe Patent Office, Office Communication, Application No. 19738639.4, dated Mar. 13, 2023, 5 pages.
International Bureau, Communication in cases for which no other form is applicable, application No. PCT/US2019/013230, May 11, 2020, 17 pages.
Observations in relation to lack of patentability of the published claims of PCT/US2019/013230; third-party observations submitted May 11, 2020, 11 pages.
L.A. West and G.A. Somorjai; Effects of Surface Disorder, Various Surface Structures of Chemisorbed Gases and Carbon on Helium Atomic Beam Scattering from the (100) Surface of Platinum, J. Chem. Phys.54, 2864 (1971) https://doi.org/10.1063/1.1675266.
P. Moore; The Effect of Aerodynamic Lift on Near Circular Satellite Orbits, Planet. Space. Sci., vol. 33, No. 5, pp. 479-491, 1985.
J.T. Visentine (ed); Atomic Oxygen Effects Measurements for Shuttle Missions STS-8 and 41-G Nasa Technical Memorandum 100459, 1988.
Masahito Tagawa, Koshi Matsumuto, Hiroaki Doi, Kumiko Yokota and Nobuo Ohmae; Atomic Oxygen Concentration Using Reflecting Mirrors, Protection of Materials and Structures from Space Environments, 417 - 429, J.I. Kleiman (ed), 2006.
Peter Roberts; Discoverer Radically Redesigning Earth Observation Satellites for Sustained Operation at Significantly Lower Altitudes, as presented at Uk Space Conference 2017 at 12:15 14:15 on Thursday Jun. 1, 2017, 6 Pages.
S.J.Tomaczk, M.E. Wright, A.J. Guenthner, B.J. Petteys, T.K. Minton, A. Brunsvold, V. Vij, L.M. McGrath and J.M. Mabry; Space-Survivability and Characterization of Main-Chain and Side-Chain POSS-Kapton Polyimides, Proceedings of the "Second International Symposium on Polyimides and Other High Temperature Polymers: Synthesis, Characterization and Applications, held in Newark, New Jersey, Dec. 3-6, 2001," Polyimides and Other High-temperature Polymers: Synthesis, Characterization, and Applications. vol. 5, pp. 227-245, K. L.
Rihito Kuroda, Tomoyuki Suwa, Akinobu Teramoto, Rui Hasebe, Shigetoshi Sugawa and Tadahiro Ohmi; Atomically Flat Silicon Surface and Silicon/Insulator Interface Formation Technologies for (100) Surface Orientation Large-Diameter Wafers Introducing High Performance and Low-Noise Metal-InsulatorSilicon FETs, IEEE Transactions on Electron Devices, vol. 56, No. 2, pp. 291-298, Feb. 2009.
J. C. Valer; A Study of the Chemistry Between Fast Atomic Oxygen and Silver-Coated QCM Crystals, Master's Thesis, University of Tennessee, 2002. https://trece.tennessee.edu/utk_gradthes/2135; see also as referenced therein: Alan C. Tribble; The Space Environment: Implications for Spacecraft Design, Princeton University Press, Princeton, NJ, 1995.
Gouzman, et al.; Liquid Phase Deposition of Titania Thin Films on Kapton and Posspolyimide, presented at 11th ISMSE, Aix-en-Provence, France, p. 12, Sep. 15-18, 2009.
Protecting Polymers from the Natural Space Environment with Films Grown Using Atomic Layer Deposition, https://www.sbir.gov/sbirsearch/detail/83364, 2007.
Qian, Min et al.; Resistance of POSS Polyimide Blends to Hyperthermal Atomic Oxygen Attack, ACS Applied Materials & Interfaces, Nov. 7, 2016, 11 pages.
Minton, Timothy K. et al.; Protecting Polymers in Space with Atomic layer Deposition Coatings, ACS Applied Materials & Interfaces, vol. 2, No. 9, Aug. 25, 2010, 11 pages.
Official Communication pursuant to Article 94(3) EPC, European Patent Application No. 19 738 639.4, dated Aug. 6, 2024, 5 pages.

\* cited by examiner

ATOMIC OXYGEN-RESISTANT, LOW DRAG COATINGS AND MATERIALS

CROSS REFERENCE TO RELATED APPLICATIONS

This application is a continuation of U.S. Non-Provisional patent application Ser. No. 16/811,869, filed Mar. 6, 2020, which is a continuation of U.S. Non-Provisional patent application Ser. No. 15/881,417, filed Jan. 26, 2018, entitled "Atomic Oxygen-Resistant, Low Drag Coatings and Materials," issued as U.S. Pat. No. 10,583,632, which claims priority to U.S. Provisional Patent Application No. 62/616,325, filed Jan. 11, 2018, entitled "Atomic Oxygen-Resistant, Low Drag Coatings and Materials." The entirety of all of which are incorporated herein by reference.

BACKGROUND OF THE INVENTION

Field of the Invention

The present technology relates to coatings and materials that can minimize atomic oxygen (AO) degradation and reduce drag on an object, such as a spacecraft. The present technology also relates to a method of reducing drag and minimizing AO degradation of spacecraft intended to operate in harsh environments, such as stable Earth orbits at about 100 km-350 km, or orbits around other celestial bodies, such as Mars, that offer similar harsh conditions.

Description of Related Art

Satellite orbital altitudes above Earth are typically categorized in three broad segments: low Earth orbit (LEO), medium Earth orbit (MEO) and geostationary Earth orbit (GEO). The general uses and characteristics of these orbits are shown in Table I and represent generally accepted usage of the terms LEO, MEO and GEO. Satellites can orbit at any altitude, and the gaps in altitude shown in Table 1, such as between LEO and MEO, are also used, if less regularly. It is also common that satellites may orbit in eccentric, non-circular orbits, thereby passing through a range of altitudes in a given orbit.

| Orbit | Altitude, km | Velocity, km/s | Exemplary Uses | Comments |
|---|---|---|---|---|
| LEO | 400-2,000 | 6.9-7.8 | Earth observation, sensing, ISS, telecom constellations | Random orbits, 3-10 Y lifetime, space junk issue, little radiation |
| MEO | 15,000-20,200 | 3.5-3.9 | GPS, GLONASS, Earth observation | Highest radiation (Van Allen Belt), equatorial to polar orbits |
| GEO | 42,000 | 3.1 | Sat TV, high BW telecom, weather satellites | Can remain above same spot on Earth, typically equatorial orbits |

Atomic oxygen (AO) dominates the rarefied atmosphere at altitudes of 150 to 700 km (see FIG. 1). The concentration of AO varies with altitude and is dependent on several additional factors, including solar activity, season, local time, latitude, and variations in the Earth's magnetic field. At altitudes lower than LEO, i.e. below about 400 km, atmospheric density increases exponentially. A typical O-atom number density at an altitude of 300 km is on the order of $10^9$ cm$^{-3}$, but it increases to more than $10^{10}$ cm$^{-3}$ as the altitude drops below 200 km. Orbiting spacecraft that fly at these altitudes travel at high velocities. The average relative velocity between such spacecraft and ambient oxygen atoms may be 7.4-7.8 km s$^{-1}$, depending on orbital altitude and inclination. The combination of impact velocity and O-atom density yields fluxes on the order of $10^{15}$ to $10^{16}$ O atoms cm$^{-2}$ s$^{-1}$ on ram surfaces of spacecraft. The gas-surface collisions are equivalent to oxygen atoms with a mean translational energy of ~4.5 eV striking a ram surface. The roughly 1000 K kinetic temperature of the atmosphere produces an energy spread (full width at half maximum) of 2 eV in the gas-surface collisions. Energetic collisions of ambient oxygen atoms [ground-state, O($^3$P)] with spacecraft surfaces lead to degradation of materials through oxidation and etching (erosion).

Structural and thermal-control materials consisting of organic polymers are particularly susceptible to oxygen-atom attack. High-energy collisions lead to the production of volatile products that carry mass away from the polymer surface and leave a roughened surface. Polymeric materials on spacecraft in LEO are also susceptible to high fluxes of vacuum ultraviolet (VUV) radiation, which may promote their degradation through multiple photochemical processes. Photons might act either alone or in combination with oxygen atoms to degrade polymers and thus limit their usefulness.

Kapton (polyimide) and FEP Teflon are commonly used in thermal blankets on an oxidizing external surface of spacecraft. Both of these materials are subject to erosion in the space environment. Even though FEP Teflon is predicted to have a lower erosion depth, this material is still expected to erode ~40 µm at 330 km, ~200 µm at 240 km, and ~1.6 mm at 160 km during a three year mission. The estimates at lower altitudes are conservative, as collision-induced processes involving $N_2$ are expected to play a significant role in assisting O atoms in the erosion of the material. It is clear that unprotected carbon-based materials (even fluorocarbon materials) will erode significantly during a three-year mission at relatively low Earth orbital altitudes. Given the harsh environment in LEO steps must be taken to protect polymers that are to be used on spacecraft that operate in this environment, or make such polymers more durable.

Common approaches to make polymers more durable in LEO involve inorganic constituents, either as coatings, particle additives or fillers, or components of the polymer backbone.

Spacecraft coating materials for protecting polymers include metals, metal oxides, and semiconductor oxides. Potential metal coatings, such as silver and copper, have been tested in the LEO environment, but they oxidize readily and need to be protected. For some specialty applications, the noble metals, gold and platinum, should be durable in an oxidizing environment. The metal oxide coatings, $Al_2O_3$, $TiO_2$, and $SnO_2$, have shown remarkable resistance to atomic oxygen (AO) attack. Still, the most commonly used coating material is the semiconductor oxide, $SiO_2$, which is almost as resistant to an AO attack as $Al_2O_3$ and, like $Al_2O_3$, does not alter the thermo-optical properties of the material in a deleterious way. However, such inorganic coatings are subject to cracking through handling and thermal cycling, and to damage such as pinholes, cracks, or scratches from micrometeoroid and debris impacts, leaving the underlying material exposed to AO attack.

Particle additives to improve polymer durability include nanoclay, silica, and graphite. Adding particles of these materials is attractive because large-scale films of the composite materials can be produced simply and with relatively low cost. Some such polymer nanocomposites exhibited better AO resistance than control samples of pure polymer. For example, an epoxy/silica blend (with 5 wt % of 100 nm diameter silica particles) showed an erosion yield of only $0.18 \times 10^{-24}$ cm$^3$ atom$^{-1}$ after exposure to an AO fluence of $1.97 \times 10^{21}$ O atoms cm$^{-2}$. This erosion yield compares favorably to the commonly used Kapton H and HN polyimide films, whose erosion yields are $3.00 \times 10^{-24}$ cm$^3$ atom$^{-1}$ and $2.80 \times 10^{-24}$ cm$^3$ atom$^{-1}$, respectively. On the other hand, polymer nanoclay composites do not have such high AO resistance, and erosion yields in an AO plasma of $0.78 \times 10^{-24}$ cm$^3$ atom$^{-1}$ and $2.91 \times 10^{-24}$ cm$^3$ atom$^{-1}$ for nylon/7.5 wt % nanoclay (Nanocor I.30, with size of 8-10 μm) and epoxy/6.0 wt % nanoclay (Nanocor I.30, with size of 8-10 μm) composites, respectively, have been reported. As these inorganic additives do not dissolve in polymers, they usually aggregate to form inorganic protective layers as organic material erodes away. However, these protective layers are not continuous, so O atoms can penetrate between the gaps and continue the etching of the organic component. Another potential problem with particle additives is that they might lead to undesirable mechanical properties of the material.

Copolymerization of organic polymers, such as polyimides, with an appropriate inorganic monomer has the advantage that the inorganic component is uniformly dispersed and can form an essentially continuous passivating oxide layer when the hybrid copolymer is subjected to AO bombardment. Because the polyimide (PI), Kapton, is often used on the external surfaces of spacecraft, the majority of the hybrid copolymers that have been studied involve PI as the main component.

Polyimide copolymers that have shown good AO resistance are polyimide polymers that incorporate polyhedral oligomeric silsequioxanes (POSS). One type of polyimide-POSS copolymer (POSS-PI) incorporates the POSS monomer into the main polyimide polymer backbone, referred to as a main-chain (MC) POSS-PI polymer. Another type of polyimide-POSS copolymer incorporates the POSS monomer as a pendant group on the main polyimide polymer backbone, referred to as a side-chain (SC) POSS PI. One drawback of the POSS monomers that are functionalized for copolymerization with PI is that they are expensive to synthesize, and the copolymerization process is not conducive to low-cost and large-scale fabrication of POSS PI materials or films.

In addition to being subjected to degradation, LEO spacecraft may be in a constant state of very slight atmospheric drag, requiring either regular boost to their altitude (e.g. fuel burns) or an end-of-useful-life caused by reentry and burn up similar to a meteor entering the Earth's atmosphere. As an example, the International Space Station (ISS), orbiting at about 425 km, loses approximately 2-4 km/month of altitude and requires regular fuel burns to ensure it stays in proper orbit. But the atmospheric drag at this altitude is still very low and LEO spacecraft can remain in orbit for years without fuel burns.

At altitudes below about 400 km to about 120 km, atmospheric density that causes atmospheric drag increases by an order of magnitude about every 50-75 km. Below an altitude of about 120 km, the atmospheric density increases by an order of magnitude about every 20 km. The key effect is that atmospheric density, and therefore drag, is about 5 orders of magnitude higher at an altitude of 100 km compared to the altitude of the ISS. Due to the atmospheric drag at these altitudes, thrust is provided on a continuous or near-continuous basis or the spacecraft's orbit will decay in a matter of days, weeks or months, depending on altitude. Accordingly, very few spacecraft operate below about 400 km, and those that do are often in highly elliptical orbits, thus spending very little time at the lower altitudes. Altitudes in the range of about 100 km to about 350 km are herein termed "very low Earth orbit".

Spacecraft that can operate at lower altitudes of about 100 km-350 km offer advantages of reduced size, weight, and power consumption, which in theory allows for much lower cost spacecraft. However, atmospheric drag becomes a major consideration for orbits in this altitude range. Another consideration that is important regarding the magnitude of drag is the surface roughness that develops when a material is eroded by atomic oxygen in very low Earth orbit. When polymer and carbon surfaces become eroded, they typically develop very rough surfaces. This roughness has a profound effect on the scattering dynamics of gaseous species from the surface, which is an important consideration for drag.

The combination of higher oxygen atom density and increased drag at altitudes below about 400 km presents a need for materials that can satisfy the requirements of oxygen atom resistance and reduced drag under very low Earth orbit (less than 400 km) conditions, or comparable harsh conditions surrounding other celestial bodies. Such materials should also be able to maintain atomic oxygen resistance and reduced drag for multiple months or even years, in order to enable practical missions where a spacecraft will continuously or regularly pass through altitudes of about 100 km-350 km.

SUMMARY OF THE INVENTION

The present technology provides atomic oxygen resistant, low drag materials that can be used in harsh environments, such as very low Earth orbit, or oxidizing orbits around other celestial bodies. The materials comprise an atomic oxygen resistant material having an atomically smooth surface, wherein ($E_{out}/E_{in}$) is between 0.5 and 1.0, where $E_{in}$ is the average incident kinetic energy and $E_{out}$ is the average exit kinetic energy when a stream of atoms or molecules scatters inelastically from the surface, and $\theta_{out}$ is greater than $\theta_{in}/2$, where $\theta_{in}$ is the average incident angle and $\theta_{out}$ is the average exit angle when a stream of atoms or molecules scatters inelastically from the surface, the angles being defined relative to a line normal to the surface and $\theta_{in}$ and $\theta$out are on opposite sides of the line normal to the surface. In one embodiment, the atomic oxygen resistant, low drag materials can be used on at least one surface of a spacecraft intended to orbit at latitudes of 100 km-350 km above the Earth.

In another aspect, the present technology provides a method of increasing the atomic oxygen resistance and reducing drag on a spacecraft. The method comprises providing an atomic oxygen resistant material on at least a portion of the spacecraft such that the atomic oxygen resistant material has an atomically smooth surface, wherein ($E_{out}/E_{in}$) is between 0.5 and 1.0, where $E_{in}$ is the average incident kinetic energy and $E_{out}$ is the average exit kinetic energy when a stream of atoms or molecules scatters inelastically from the surface, and $\theta_{out}$ is greater than $\theta_{in}/2$, where $\theta_{in}$ is the average incident angle and $\theta_{out}$ is the average exit angle when a stream of atoms or molecules scatters inelastically from the surface, the angles being defined relative to a line normal to the surface, and $\theta_{in}$ and $\theta_{out}$ are on opposite sides of the line normal to the surface.

DETAILED DESCRIPTION OF THE INVENTION

Figure 1:
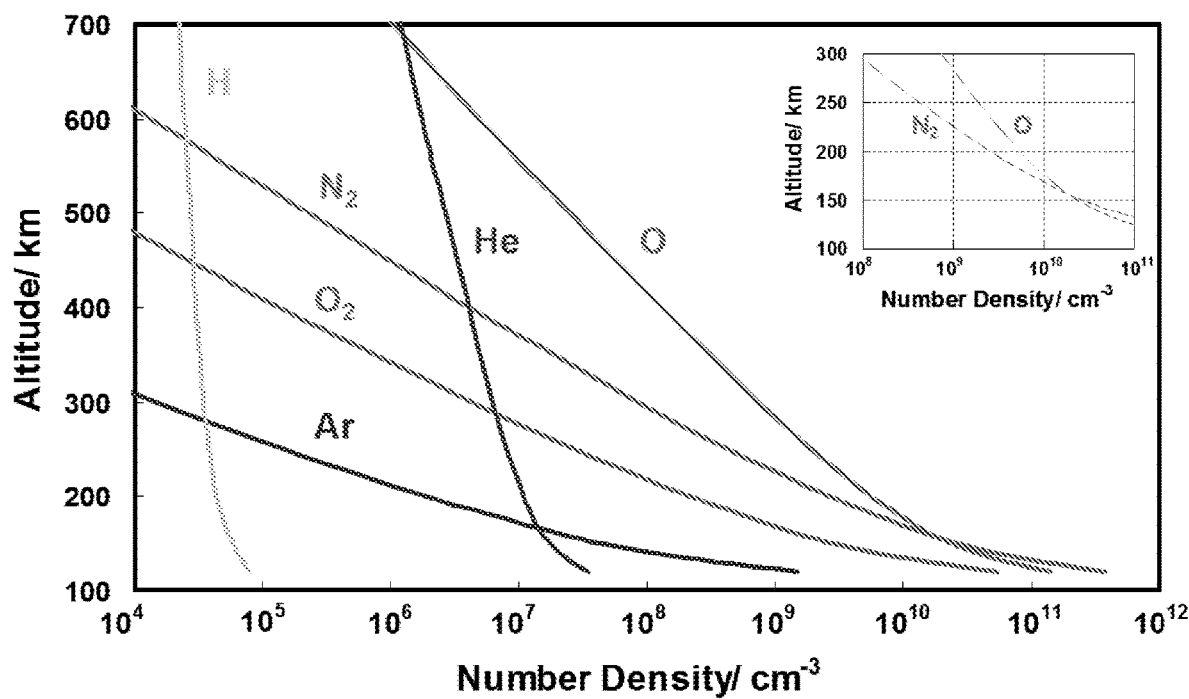
FIG. 1 illustrates graphical data of density of air versus altitude.

The present technology provides materials that are atomic oxygen resistant and provide reduced drag on spacecraft intended to operate in harsh environments, such as the harsh conditions present at stable Earth orbits at about 100 km to about 350 km, or comparable harsh conditions present around other celestial bodies, such as Mars. The materials of the present technology comprise an atomic oxygen resistant material having an atomically smooth surface that provides for low drag (described further herein) even when exposed to an oxidizing environment.

The term "atomic oxygen resistant" as used herein refers to materials that are not readily susceptible to oxidation and/or erosion from oxygen atoms.

The terms "reduced drag" and "drag reduction" are used herein in comparison to a case of maximum drag, where all the incident atoms or molecules scatter diffusely from the surface, with the peak scattered flux occurring in the direction of a line normal to the surface.

The term "low drag" as used herein refers to a surface that provides less than 50% of the drag in the diffuse scattering limit or maximum drag.

Atomic Oxygen Resistant Materials

A variety of materials that have atomic oxygen resistance can be used in the present technology. One example of an atomic oxygen resistant material is a polymeric material such as a copolymer of a polyimide monomer and polyhedral oligomeric silsesquioxane (POSS). POSS polymers have been copolymerized with the Kapton-like polyimide (PI), pyromellitic dianhydride oxydianiline (PMDA-ODA) to form a polymer having good atomic oxygen resistance. Alternative POSS copolymers that have been studied and shown to have good atomic oxygen resistance are a copolymer in which cyclopentyl POSS monomer is incorporated into the main polymer backbone, referred to as main-chain (MC) POSS PI, and a copolymer prepared by grafting a N-[(hepta-isobutylPOSS)propyl]-3,5-diaminobenzamide POSS monomer as a pendant group on the main polymer backbone, referred to as side-chain (SC) POSS PI. In a laboratory test environment with hyperthermal AO, and in exposures on the International Space Station as part of the Materials Interactions Space Station Experiments (MISSE-1, MISSE-5, and MISSE-6) it was found that the erosion yield of these POSS PI materials depended primarily on the wt % of the silicon-oxygen cage and not on how the POSS monomer was bonded to the polymer backbone. With a hyperthermal AO fluence of $2.70 \times 10^{20}$ O atoms cm$^{-2}$, the erosion yields of 7.0 wt % $Si_8O_{12}$ SC POSS PI and 7.0 wt % $Si_8O_{11}$ MC POSS PI were 0.15 and $0.13 \times 10^{-24}$ cm$^3$ atom$^{-1}$, respectively. In a space-flight AO test with a fluence of $1.80 \times 10^{20}$ O atoms cm$^{-2}$ on MISSE-5, the erosion yield of 7.0 wt % Sisal MC POSS PI was $0.14 \times 10^{-24}$ cm$^3$ atom$^{-1}$. The erosion results from space-flight and hyperthermal AO beam tests at similar AO fluences were comparable, indicating that the hyperthermal AO beam faithfully replicates the AO effects observed in LEO experiments. In a space-flight AO test of $1.97 \times 10^{21}$ O atoms cm$^{-2}$ on MISSE-6, the erosion yields of 7.0 wt % $Si_8O_{12}$ SC and Sisal MC POSS PIs were 0.07 and $0.05 \times 10^{-24}$ cm$^3$ atom$^{-1}$, respectively. A much longer exposure on MISSE-1 to an AO fluence of $8 \times 10^{21}$ O atoms cm$^{-2}$ yielded a very low erosion yield of $0.026 \times 10^{24}$ cm$^3$ atom$^{-1}$ for 3.5 wt % $Si_8O_{11}$ MC POSS PI.

One advantage of the POSS PI copolymers is that the copolymers form an essentially continuous passivating $SiO_2$ layer when the copolymer is subjected to AO bombardment. Higher AO fluence exposures of POSS PIs typically lead to lower erosion yields, as a result of the growing and increasingly impenetrable $SiO_2$ layer on the surface. Although POSS PI copolymers have good AO resistance, the POSS monomers that are functionalized for copolymerization are typically expensive to synthesize, and the copolymerization process is not conducive to low-cost and large-scale fabrication of POSS PI films.

A less costly alternative to POSS PI copolymers is a blend of a POSS monomer with a polyimide. Such blends have similar erosion rates and yields as the POSS-PI copolymers at similar weight percentages of the silicon-oxide cage, and likewise form an essentially continuous passivating $SiO_2$ layer when subjected to AO bombardment. In some embodiments, the POSS-containing material can have a silicon oxide content of at least 3.5 wt %, where silicon oxide content refers to the total number of silicon and oxide atoms present in the material. It is expected that both the POSS PI copolymers and the blends of POSS and polyimide have acceptable thermal and mechanical properties at silicon-oxide cage loadings up to 7 wt %, and could provide an AO resistant substrate for use in the present technology.

Although POSS copolymers show good AO resistance, the POSS copolymer surfaces typically become rough as they are bombarded with atomic oxygen, and this surface roughness significantly affects the scattering dynamics of gaseous species from the surface. As the surface becomes rougher, the momentum transfer from gaseous species increases, resulting in increased drag. One aspect of the present technology is the recognition that, to minimize drag, the surfaces must be as smooth as possible on an atomic level, and remain as smooth as possible in an oxidizing environment. POSS-containing polymers, however, become rough as they react with atomic oxygen and form a passivating oxide layer. Such surfaces will therefore not minimize or reduce drag on a spacecraft operating in a very low Earth orbit.

Other examples of AO resistant materials for use on spacecraft include metals, metal oxides, and semiconductor oxides. These materials have been employed as coatings or as grafts or as additives to protect polymeric substrates, such as Kapton, that are vulnerable to AO attack. Examples of such materials include $SiO_2$, $Al_2O_3$, ZnO, $TiO_2$, $SnO_2$, $In_2O_3$, $ZrO_2$ and other metal oxides, or atomic-oxygen resistant compounds, combinations of these oxides or O-atom resistant compounds, oxides or O-atom resistant compounds with dopants, paints that incorporate these oxides or oxide mixtures or doped oxides or O-atom-resistant compounds.

Several processes have been used to deposit the metal, metal oxide and semiconductor oxides as protective coatings. Typical processes include vapor deposition, chemical vapor deposition, plasma-enhanced chemical vapor deposition, cathodic arc deposition, ion implantation, chemical grafting, or spraying or brushing. However, such processes can leave the coating surface rough, and the coatings themselves or coatings that form from reaction with atomic oxygen are subject to cracking through handling and thermal cycling, and to damage from micrometeoroid and debris impacts, leaving the underlying material exposed to AO attack.

One alternative process that can form a continuous, angstrom-level-controlled, defect free coating is atomic layer deposition (ALD). ALD is a variation of chemical vapor deposition (CVD) that does not rely on line-of-sight to the substrate and does not employ the high substrate temperatures that CVD typically requires. The process is a gas-phase method based on two sequential self-limiting surface reactions. Each surface reaction allows only about 1 monolayer of deposition. For $Al_2O_3$, the binary reaction is:

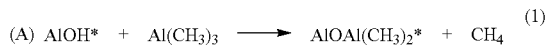

where the asterisks indicate the surface species. If each reaction is self-limiting and self-terminating, then the repetitive application of these reactions in an ABAB . . . sequence can produce atomic layer controlled $Al_2O_3$ deposition. $Al_2O_3$ ALD can be deposited at the low temperatures required for coating polymeric substrates.

Other chemistries permit the deposition of a variety of different coatings, such as ZnO, $TiO_2$, and $SiO_2$, and multilayer coatings of different composition are possible. For the ALD of $TiO_2$ and $SiO_2$ films, the $MCl_4+2H_2O \rightarrow MO_2+4HCl$ reaction for $MO_2$ deposition (where M=Si or Ti) is divided into the following two half-reactions:

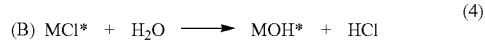

Conducting sequential reaction cycles enables the controlled growth of the metal oxide coating, thereby producing coatings of particular desired thicknesses. ALD coatings having a thickness of at least about 35 angstroms have been successful at preventing erosion of the underlying substrate due to atomic oxygen attack. Other coating thicknesses may be used as needed for a given design or application.

Even though an ALD coating can be made very smooth and defect-free, the coating might eventually become compromised from handling, thermal cycling, or micrometeoroid impacts. While micrometeoroids cannot be avoided, ALD coatings can resist the formation of defects from thermal cycling and handling because they can be extremely thin and deform to some extent with the substrate. The pliability of the ALD coating can even be enhanced by depositing mixed inorganic/organic layers. Although ALD coatings would not be expected to have as many defects as conventional coatings, defects can still form from micrometeoroid and debris impacts, leaving the substrate vulnerable to attack and allowing deep etch pits to form near any defect. As etch pits in the substrate grow, they will undercut the coating and the unsupported coating will then fall off, exposing a larger area of substrate to atomic oxygen attack. Thus, etch pits will grow nonlinearly with atomic oxygen dose. Etch pits and other defects increase surface roughness, resulting in increased drag. Accordingly, while atomic oxygen resistance is an important property for the materials and coatings of the present technology invention, it alone may not be sufficient to provide and maintain an atomically smooth surface.

Figure 2:
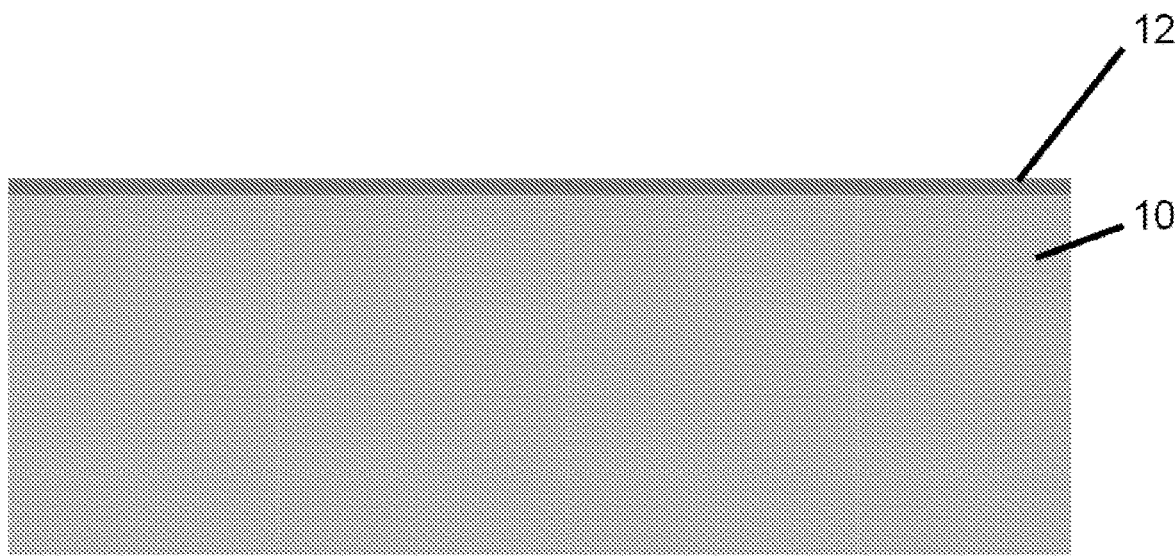
FIG. 2 is a cross-sectional view of one embodiment of the oxygen resistant material of the present technology, with an atomic oxygen resistant coating on a substrate that is also resistant to atomic oxygen.

The present technology is directed to the difficulty of providing materials and coatings that maintain atomic oxygen resistance and surface smoothness in a gaseous oxidizing environment. In one embodiment, this difficulty can be overcome by the combination of an atomic oxygen resistant substrate and an atomic oxygen resistant coating deposited on the substrate. An example of this embodiment is shown in FIG. 2, where an oxygen resistant substrate 10 has an oxygen resistant coating 12 deposited on the surface of the substrate 10.

It is contemplated that any atomic oxygen resistant material could be used to form the atomic oxygen resistant substrate 10. Examples of atomic oxygen resistant materials for use as the substrate include any of the POSS-containing materials discussed above. Alternatively, metal oxides, semiconductor oxides, or oxide-forming elements or compounds that are atomic oxygen resistant, or combinations of such oxides, can be used as the substrate material. For example, a polished silicon wafer could be used as the substrate material.

It is contemplated that the atomic oxygen resistant coating 12 can be any of the metal, metal oxide, or semiconductor oxide materials described above, or combinations thereof, provided they have an atomically smooth surface that provides for reduced or low drag even when exposed to an oxidizing environment.

The coating 12 can be deposited on the AO resistant substrate 10 by any method that can form a continuous, angstrom-level controlled, defect free coating. Methods or techniques for depositing the coating may include ALD, low temperature or downstream CVD, or molecular beam epitaxy (MBE). Other deposition techniques known in the art may be used.

Figure 3:
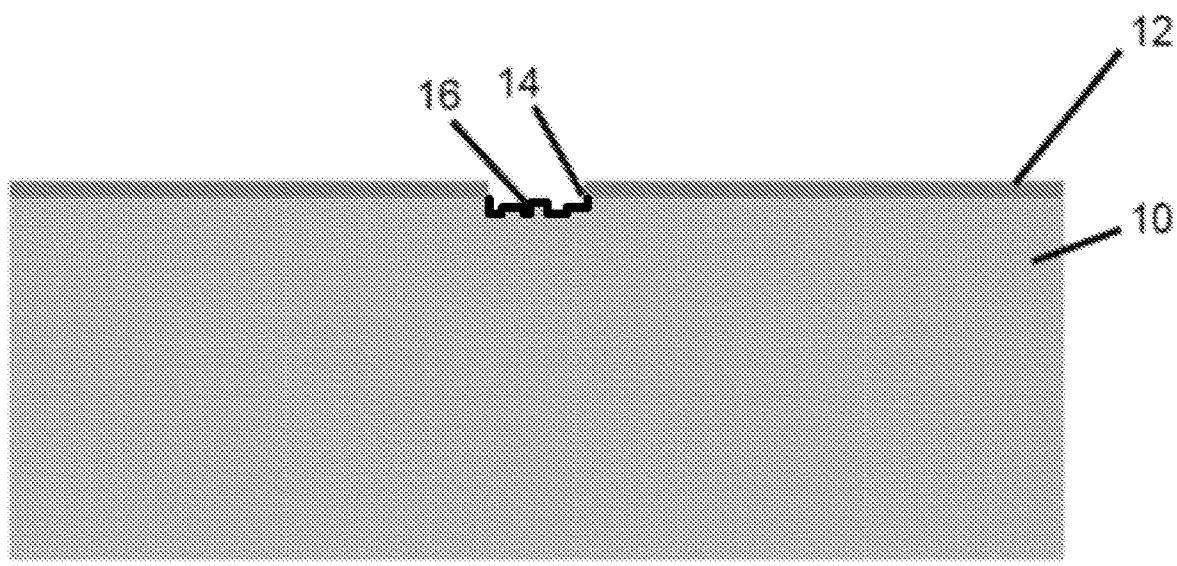
FIG. 3 shows the FIG. 2 embodiment with a passivating layer that forms on a surface that becomes exposed to an oxidizing space environment as a result of a defect in or damage to an atomic oxygen resistant coating.

In one embodiment, ALD is used to deposit the coating. The ALD coatings are conformal, so they are at least as smooth as the surface of the underlying substrate. In practice, the buildup of many atomic layers on the surface actually tends to smooth over imperfections in the substrate surface on the nanometer scale, making the resulting coating surface even smoother than that of the substrate. POSS polyimide surfaces can be prepared with an rms roughness of ~2.5 nm, so one would expect that the surface of an ALD coating on this substrate would be smoother than this. The value of using an atomic oxygen resistant substrate 10, such as a POSS-PI substrate or a polished silicon substrate, is that it will form a passivating $SiO_2$ layer anywhere it comes into contact with O atoms. As shown in FIG. 3, if a defect 14 does occur in the coating 12, this passivating layer 16 will form upon contact with the atomic oxygen atoms. The passivating layer 16 may prevent any significant erosion of the atomic oxygen resistant substrate 12 around a coating defect 14 and maintain a fairly smooth surface. Although explained with respect to a particular embodiment, the present description of the ALD coating is exemplary, and not intended to limit modification or other embodiments that a person of ordinary skill would understand to be within the scope of the disclosed example.

In another embodiment, the atomic oxygen resistant low drag material could be a non-eroding material that also has an atomically smooth surface. One example of such a material is a metal oxide, such as sapphire. Due to its mechanical properties, sapphire could be used in the form of very thin sheets or layers for particular applications. In this embodiment, an additional atomic oxygen resistant coating would not be needed, since sapphire can be both atomic oxygen resistant and atomically smooth. Other materials that could be non-eroding and that also could have an atomically smooth surface include metals, metal oxides, semiconductor oxides, or combinations thereof.

Gas-Surface Scattering Effect on Drag

The drag on a spacecraft in very low Earth orbit depends mainly on the energy and momentum transfer between impinging gaseous atoms and molecules and the ram surfaces of the spacecraft. Thus, the inelastic scattering dynamics of atmospheric constituents (O, $N_2$, and $O_2$) on spacecraft surfaces at high relative velocities are necessary for the calculation of a drag coefficient.

Figure 4:
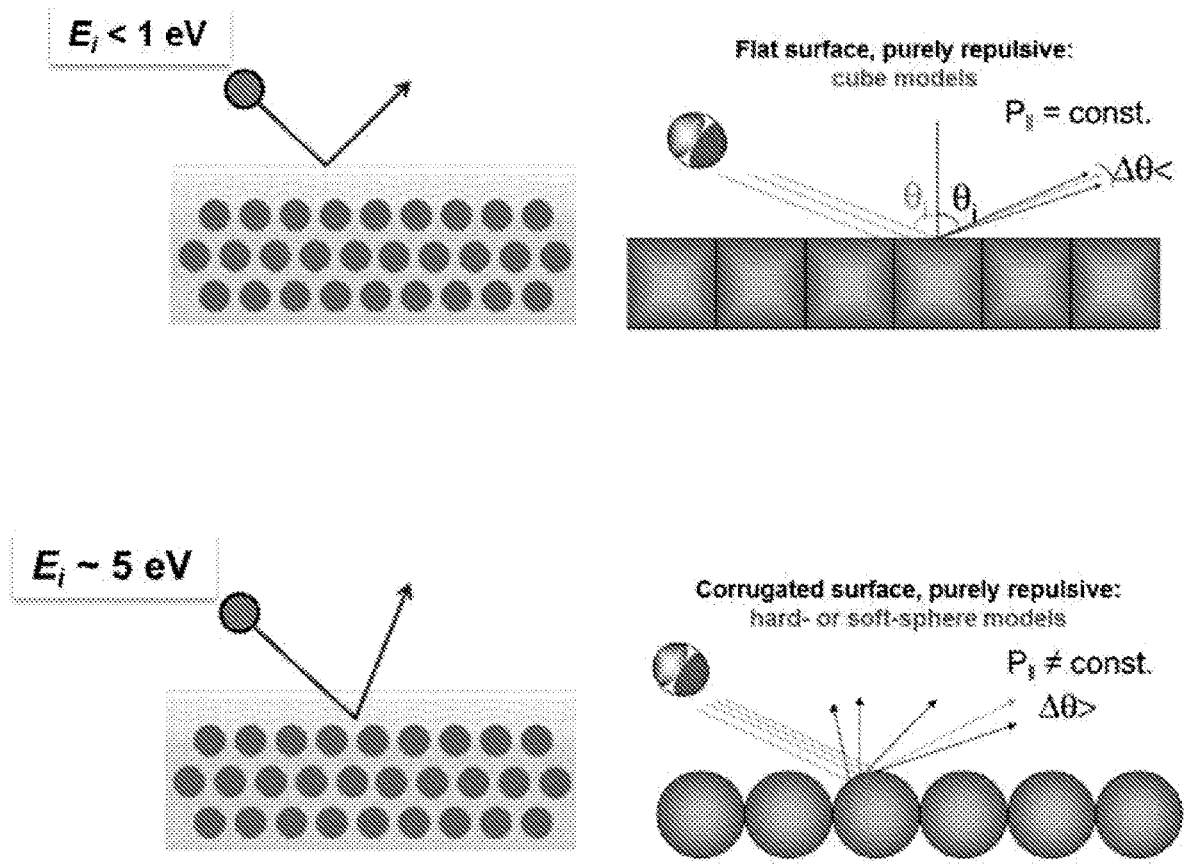
FIG. 4 illustrates the dynamics of the thermal and structural inelastic scattering regimes.

The nature of the inelastic scattering dynamics depends dramatically on the incident energy (see FIG. 4). At low incident energies, a metal surface appears extremely smooth to an incident atom, and the momentum of the atom parallel to the surface is conserved before and after the collision. Various cube models, such as the hard cube or soft cube model, have been proposed to describe the scattering in this so-called "thermal scattering regime". In this regime, the final energy is the same as the incident energy for specular scattering, whereas the final energy is higher than the incident energy for angles smaller than the specular angle, and the final energy is lower than the incident energy for final angles that are higher than the specular angle. At high incident energies, the surface looks rough to the incident atom, and parallel momentum is not conserved during the collision. Sphere-sphere scattering models have been proposed to describe scattering in this so-called "structural scattering regime". In this regime, the final energy tends to increase with final angle until very large final angles, where the final energy levels off or slowly decreases. In gas-surface scattering on ram surfaces in LEO, the structural scattering regime dominates.

Figure 5:
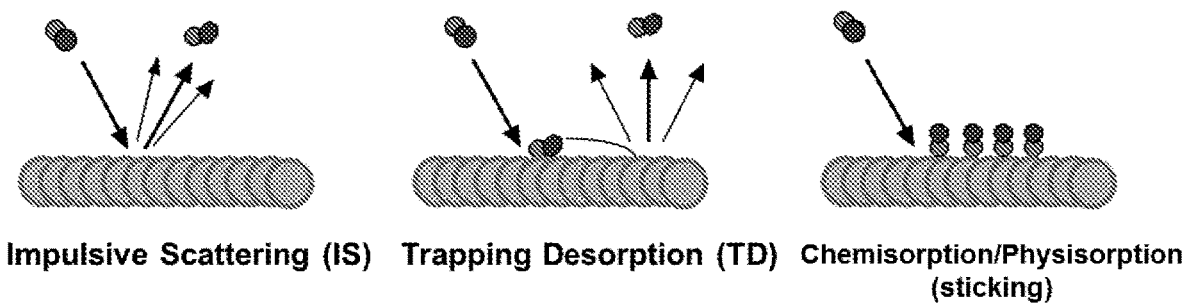
FIG. 5 shows diagrams of different gas-surface interactions.

Two basic kinds of scattering are commonly observed for non-reactive collisions: direct (or impulsive) scattering and trapping desorption (also called more generally "thermal desorption"). Chemisorption or physisorption may also occur, and these processes lead to sticking of the incident species on the surface. These gas-surface interactions are illustrated in FIG. 5. Impulsive scattering (IS) leads to atoms or molecules that exit the surface on a time scale too short for thermal equilibrium to be achieved, and the products exit the surface with high translational energies. Trapping (or thermal) desorption (TD) results in products that exit the surface with translational energies that are nominally given by the surface temperature, and these products have thermal translational energies which are typically low and given by a Maxwell-Boltzmann (MB) distribution at the surface temperature. When the incident energy is increased, there are two effects: (1) the fraction of impulsive scattering typically increases and (2) the impulsively scattered products get faster, while the thermally desorbed products keep the same velocities as given by the surface temperature. The two types of scattering have very different angular distributions. The impulsively scattered products tend to scatter with a lobular angular distribution roughly in the specular direction, whereas the thermally desorbed products have maximum flux in the direction parallel to a line normal to the surface and typically exhibit a cosine angular flux dependence with respect to this direction. When products desorb thermally, this situation is sometimes called "diffuse scattering". When incident atoms or molecules undergo trapping desorption or chemi/physisorption, they lose essentially all their incident energy to the surface.

On the other hand, atoms or molecules which scatter impulsively from the surface only deposit a fraction of their incident energy (perhaps 10%-50%) on the surface. Thus, in order to minimize drag, it is important to find a set of conditions that maximizes impulsive scattering with minimum energy transfer to the surface. For the high incident energies of gas-surface interactions in environments such as very low Earth orbit, this set of conditions can be met with smooth surfaces and grazing incident angles. A diagram showing a calculation of drag is shown in FIG. 6.

Figure 6:
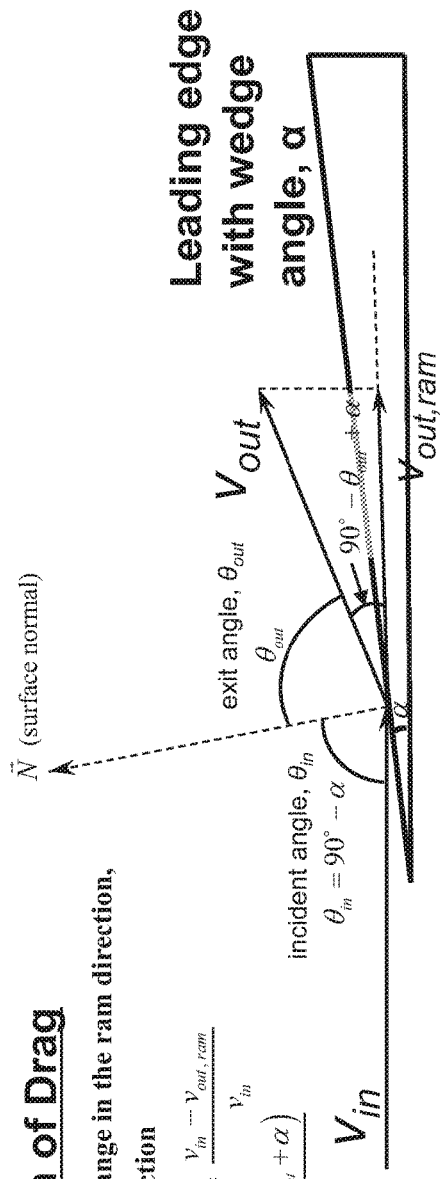
FIG. 6 is a diagram illustrating a calculation of drag.

The calculation of drag in FIG. 6 is described in comparison to maximum drag that occurs when all the incident atoms or molecules scatter diffusely from the surface. This diffuse scattering represents full momentum and energy accommodation on the surface, i.e., the incident kinetic energy of the atoms or molecules is lost to the surface. As shown in FIG. 6, when the angle of incidence is large relative to the surface normal (grazing incident angle) and the exit angle is also large, the atoms or molecules scatter impulsively and momentum accommodation is reduced. Impulsive scattering can be increased and diffuse scattering decreased with a surface that is sufficiently smooth on an atomic level. A sufficiently smooth surface is one in which $E_{out}/E_{in}$ is between 0.5 and 1.0, where $E_{in}$ represents the average incident kinetic energy and $E_{out}$ represents the average exit kinetic energy when a stream of atoms or molecules scatters inelastically from the surface, and $\theta_{out}$ is greater than $\theta_{in}/2$, where $\theta_{in}$ is the average incident angle and $\theta_{out}$ is the average exit angle when a stream of atoms or molecules scatters inelastically, the angles being defined relative to the a line normal to the surface (surface normal), as shown in FIG. 6. Such a surface is atomically smooth and provides a substantial reduction of the diffuse scattering limit or maximum drag. In one example calculation, shown in FIG. 6, where $E_{out}/E_{in}$ is 0.8, $\theta_{out}$ is 60° and α is 20°, the atomically smooth surface can provide a drag reduction of approximately 57.5% compared to a surface that provides maximum drag, where all the incident atoms or molecules scatter diffusely, with the peak scattered flux occurring in the surface normal direction. In some embodiments, an atomically smooth surface can provide a drag reduction of at least about 10%, for example a reduction of about 10% to about 60%, alternatively about 15% to about 60%, alternatively about 20% to about 60%, alternatively about 25% to about 60%. In some embodiments of the low drag coatings and materials of the present technology, the atomically smooth surface can provide a drag reduction of about 50% to about 60% compared to a surface that provides maximum drag. Stated differently, in some embodiments, the atomically smooth surface can provide approximately less than 50% of the drag in the diffuse scattering limit or maximum drag.

A molecular beam apparatus can be used for the study of gas-surface interactions. Such an apparatus, and the techniques for using it in the study of gas-surface interactions is disclosed in Murray, V. J.; et al., "Gas-Surface Scattering Dynamics Applied to Concentration of Gases for Mass Spectrometry in Tenuous Atmospheres", J. Phys. Chem. C 2017, 121, 7903-7922, which is hereby incorporated by reference.

For studies of gas-surface interaction dynamics, a velocity-selected beam is directed at a (temperature-controlled) target surface at a selected angle of incidence. The products that scatter from the surface (either inelastically or reactively) are collected as a function of their flight time and scattering angle with the use of the rotatable mass spectrometer detector. The angularly resolved time-of-flight distributions for mass-selected products are used to derive angularly resolved velocity distributions, $I(\theta, v)$, or translation energy distributions, $I(\theta, E_T)$, where I is proportional to product flux. Knowing the translational energies and angles of the scattered products, which are identified by mass spectrometry, allows several inferences to be made about the interaction mechanisms at the surface. For example, a preference for specular scattering with relatively large final translational energies indicates direct impulsive scattering. On the other hand, if the products exit the surface with a MB translational energy distribution in a cosine angular distribution about the surface normal, then one would conclude that the interaction with the surface occurs in thermal equilibrium (TD).

Figure 7:
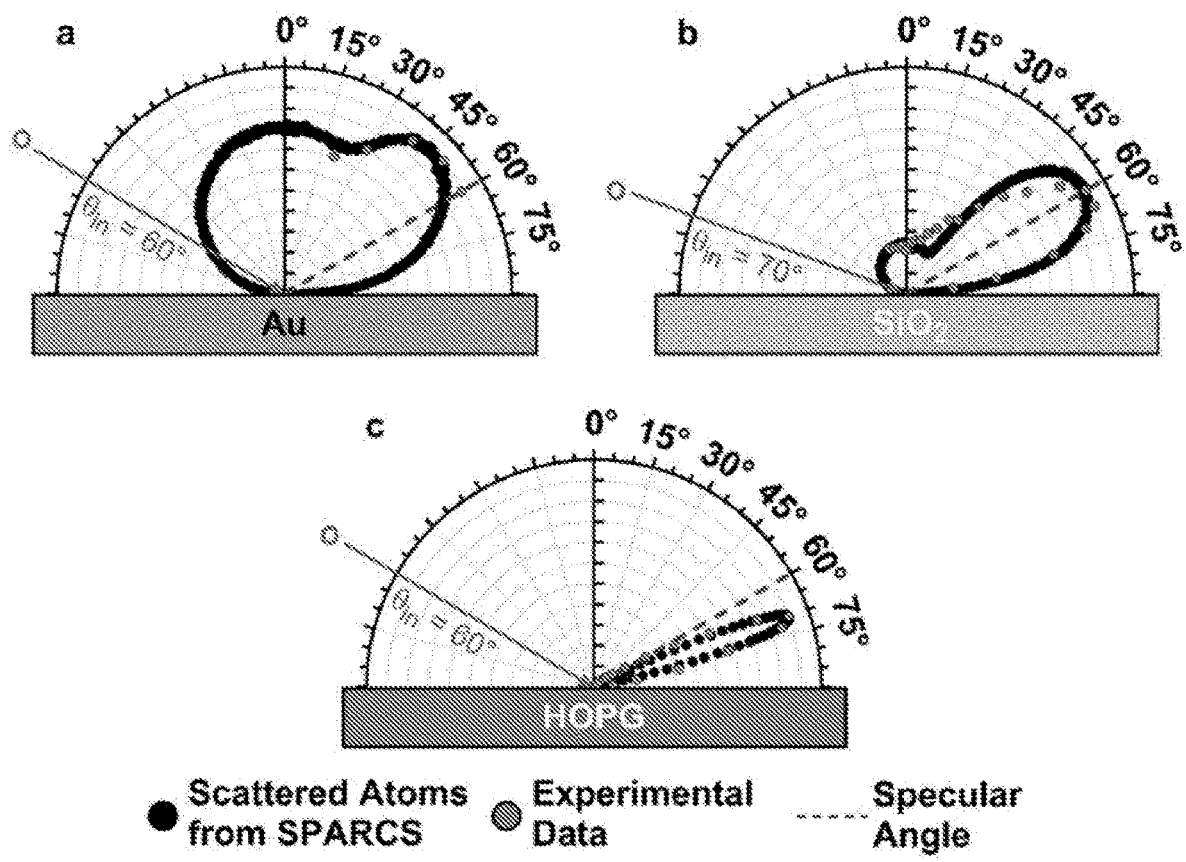
FIG. 7 shows diagrams of angular distributions of scattered O-atom flux.

The beam-surface scattering technique has been used recently to study the scattering dynamics of hyperthermal O atoms on three representative surfaces: Gold (Au), silicon dioxide ($SiO_2$), and highly oriented pyrolytic graphite (HOPG). FIG. 7 shows angular distributions of scattered O-atom flux, and Table 2 contains the experimental conditions for each sample.

TABLE 2

Experimental conditions for each sample

| Surface | RMS Surface Roughness (Å) | Incident Species | Incident Velocity (m s$^{-1}$) | Incident Energy (kJ mol$^{-1}$) | O atom % | Surface Temperature (K) |
|---|---|---|---|---|---|---|
| Au | 4.23 ± 0.17 | O | 5440.32 | 236.87 | 43.2 | 773 |
|  |  | $O_2$ | 5440.32 | 474.31 |  |  |
| $SiO_2$ | 0.94 ± 0.06 | O | 7845.09 | 495.55 | 83.7 | 675 |
|  |  | $O_2$ | 7421.83 | 889.49 |  |  |
| HOPG | 3.25 ± 1.01 | O | 5568.36 | 248.15 | 44.8 | 673, 873 |
|  |  | $O_2$ | 5568.36 | 496.81 |  |  |
|  |  | Ar | 4836.78 | 468.78 | — | 873 |

With the experimental conditions for HOPG in the table above and an angle of incidence of 70 degrees, O atoms scatter with only 5%-10% energy loss in the super-specular direction. These scattering dynamics would be ideal to minimize drag; however, this material is not suitable for use in the harsh conditions of very low Earth orbit, because HOPG reacts with atomic oxygen and will erode and form a rough surface after extended exposure to oxygen atoms. The roughened surface will promote multiple-bounce scattering on the surface and will drive incident atoms into thermal equilibrium, resulting in nearly complete energy and momentum accommodation of the incident atoms or molecules.

Gold is a chemically inert, noncatalytic surface that might be useful as a coating for some applications. Smooth thin films of gold can be produced on a variety of different substrates and geometries via a variety of different deposition techniques. In addition, gold is the only transition metal that does not have a stable oxide; $Au_2O_3$ is metastable and decomposes quickly at temperatures above 423 K. Although the broad angular distribution of O atoms that scattered from the gold surface (FIG. 7a) suggests that there is a large fraction of diffuse scattering and therefore significant energy accommodation, the translational energy distributions of the O atoms indicate that energy transfers in the range of 10% to 40% are the norm. Thus, the broad angular distribution is not the result of energy accommodation but rather the highly corrugated potential energy surface for the O—Au interaction. Similar results have been observed for $O_2$ scattering on gold. This result suggests that gold might be a suitable AO-resistant material that could be used in space to minimize gas-surface energy transfer and therefore drag. However, the optical properties of gold would not be suitable for thermal control.

$SiO_2$ has been used as an AO-resistant coating in LEO, and the transparency of this coating makes it suitable for protection of thermal control materials. The angular distributions of hyperthermal O atoms scattering from $SiO_2$ (FIG. 7b) suggest predominantly impulsive scattering with little energy accommodation. The energy distributions of scattered O (and $O_2$) products indicate that energy transfers are in a similar range as those from gold. An energy accommodation coefficient of 0.5 would thus be a conservative estimate from a design point of view. The $SiO_2$ surface in the experiments was smoother than those of HOPG and gold (Table 2), but with surfaces on this roughness scale, the corrugation of the potential energy surface for the gas-surface interaction often plays a more significant role in determining the angular distribution of scattered products, especially when energy transfers are very low. The surface corrugation is expected to be more pronounced for the insulating $SiO_2$ surface than for gold, because the electrons are tightly bound in covalent bonds. As a result of the highly corrugated interaction potential between the incident species and the surface, the scattering dynamics on perfectly smooth Au and $SiO_2$ will lead to broader angular distributions of scattered products than would be observed on HOPG, which has a minimally corrugated interaction potential. The result of the nature of the interaction of hyperthermal O atoms with a fairly smooth $SiO_2$ surface is a lobular angular distribution that is broader than that from HOPG but narrower than that from gold. The resistance of $SiO_2$ to atomic oxygen attack and the fairly low energy accommodation of hyperthermal O and $O_2$ on this surface (as long as it is smooth on the nanometer scale) make $SiO_2$ a suitable spacecraft coating material for minimizing drag in very low Earth orbit environments.

$Al_2O_3$ is another material that is AO-resistant and would likely have similar gas-surface scattering dynamics as $SiO_2$. In fact, $Al_2O_3$ is even more resistant to AO attack than $SiO_2$. The diffusion length for 5-eV O atoms on $SiO_2$ is about 5 nm, whereas it is only 3 nm for $Al_2O_3$. There is no data available for hyperthermal O-atom scattering on $Al_2O_3$, but experience would suggest that the scattering dynamics should be similar, for a given surface roughness, on $SiO_2$ and $Al_2O_3$. Moreover, both $SiO_2$ and $Al_2O_3$ can be deposited on a variety of substrates by ALD, producing smooth coatings that are defect-free. The energy accommodation coefficient on a smooth $Al_2O_3$ surface is expected to be low (<0.5), and the combination of the $Al_2O_3$ coating with a polymer substrate that can form a passivating $SiO_2$ layer when under AO attack is expected to provide an extremely durable material even in very low Earth orbit.

Applications for AO Resistant Low Drag Materials and Coatings

The AO resistant, low drag materials and coatings described herein can be applied to or form one or more surfaces of a spacecraft intended to orbit in a gaseous environment. In one embodiment, the material can be used as the top layer of multilayer insulation on the external surface of a spacecraft. In this embodiment, the material comprises a layer of an AO resistant material, such as a POSS PI copolymer or blend, and an AO resistant coating such as $SiO_2$ or $Al_2O_3$, deposited on the outer-facing surface of the polymer layer. A metal coating, such as an aluminum or silver coating, can be deposited on the opposite inner-facing side of the polymer material. This same material, without the metal coating, could also be used as a durable structural material for solar panels, if a polymer support is needed.

Other uses contemplated for the materials and coatings of the present technology include, but are not limited to, thread for sewing or joining layers of multilayer insulation together, insulating for cables, as an insulating layer beneath solar cells, as a structural material and/or coating for light baffles, including support posts; coatings for sensitive components and electrical connections, and as an AO deflecting nose of a spacecraft.

In another embodiment, an AO resistant low drag material or coating could be used on the surface of an inlet for an air-breathing ion engine. A further description of an air-breathing ion engine is provided in co-pending U.S. patent application Ser. No. 15/439,533 filed on Feb. 22, 2017, entitled "A Satellite System". For an inlet to an air-breathing ion engine that would be appropriate for flight in very low Earth orbit (e.g., less than 400 km), the incoming O, $N_2$, and $O_2$ must be able to be concentrated efficiently into the engine, and the inlet surfaces must not be roughened by O atom impact. For efficient concentration, the inlet surface must promote impulsive scattering, and the angular distributions of the scattered atoms and molecules must be narrow and peaked near, or preferably beyond, the specular angle. The specular scattering characteristics of $SiO_2$ described above suggest that a material comprising an AO resistant substrate and a $SiO_2$ or $Al_2O_3$ coating deposited on the substrate could be used on or as the surface of an inlet for an air-breathing ion engine.

The presently technology is now described in such full, clear, concise, and exact terms as to enable any person skilled in the art to which it pertains, to practice the same. It is to be understood that the foregoing describes preferred embodiments of the invention and that modifications may be made therein without departing from the spirit or scope of the invention as set forth in the appended claims.

What is claimed is:

1. A spacecraft configured to reduce drag induced by incoming atomic or molecular particles, the spacecraft comprising:
  (a) a leading edge configured at a grazing incident angle;
  (b) a multilayer atomic oxygen resistant material covering the leading edge, the multilayer atomic oxygen resistant material comprising (i) an atomic oxygen resistant substrate comprising a polymeric material comprising at least one polyimide monomer and at least one polyhedral oligomeric silsesquioxane, or a blend of at least one polyimide monomer and at least one polyhedral oligomeric silsesquioxane; and (ii) an atomic oxygen resistant coating deposited or layered on the oxygen resistant substrate and forming an atomically smooth outer-facing surface that comes in contact with the incoming atomic or molecular particles, the atomically smooth outer-facing surface configured to induce impulsive scattering of the incoming atoms or molecular particles, thereby reducing drag on the spacecraft.

2. The spacecraft of claim 1, wherein the spacecraft orbits the Earth at an altitude between 100 km and 350 km.

3. The spacecraft of claim 1, wherein the outer-facing surface provides at least a 20% reduction of drag compared to a surface that diffusely scatters incident atoms or molecules.

4. The spacecraft of claim 3, wherein the outer-facing surface provides approximately less than 50% of drag compared to a surface that diffusely scatters incident atoms or molecules.

5. The spacecraft of claim 1, wherein the atomic oxygen resistant material comprises a layer of metal, metal oxide, semiconductor oxide, or a combination thereof.

6. The spacecraft of claim 1, wherein the atomic oxygen resistant coating comprises at least one of $Al_2O_3$, $SiO_2$, ZnO, $TiO_2$, $SnO_2$, $In_2O_3$, $ZrO_2$, or combinations thereof.

7. The spacecraft of claim 1, wherein the polymeric material comprises at least 3.5 wt % silicon oxide, where silicon oxide content refers to the total number of silicon and oxygen atoms present in the material.

8. The spacecraft of claim 1, wherein the polymeric material comprises a silicon oxide content of up to $_7$ wt %, where silicon oxide content refers to the total number of silicon and oxygen atoms present in the material.

9. The spacecraft of claim 1, wherein the polymeric material provides an erosion yield of atomic oxygen resistant coating of $1\times10^{-24}$ $cm^3$ $atom^{-1}$ or less after exposure to an atomic oxygen fluence of $1.97\times10^{21}$ O atoms $cm^{-2}$.

10. The spacecraft of claim 1, wherein the atomic oxygen resistant coating is an atomic layer deposition coating.

11. The spacecraft of claim 1, wherein the leading edge is arranged to result in an angle of incidence of 70 degrees for the atoms or molecules.

12. The spacecraft of claim 1, wherein the leading edge is configured to have a wedge angle of 20°.

13. An atomic oxygen resistant material configured to reduce drag on a satellite induced by incoming atomic or molecular particles, the atomic oxygen resistant material comprising:
  (a) an atomic oxygen resistant substrate comprising a polymeric material comprising at least one polyimide monomer and at least one polyhedral oligomeric silsesquioxane, or a blend of at least one polyimide monomer and at least one polyhedral oligomeric silsesquioxane;
  (b) an atomic oxygen resistant coating deposited or layered on the substrate and forming an atomically smooth outer-facing surface that comes in contact with the incoming atomic or molecular particles, the atomically smooth outer-facing surface configured to induce impulsive scattering of the incoming atomic or molecular particles, thereby reducing drag on the satellite.

14. The atomic oxygen resistant material of claim 13 comprising a metal, a metal oxide, a semiconductor oxide, or combinations thereof.

15. The atomic oxygen resistant material of claim 13, wherein the atomic oxygen resistant coating comprises at least one layer of $Al_2O_3$.

16. The atomic oxygen resistant material of claim 13, wherein the polymeric material comprises at least 3.5 wt % silicon oxide, where silicon oxide content refers to the total number of silicon and oxygen atoms present in the material.

17. The atomic oxygen resistant material of claim 13, wherein the polymeric material provides an erosion yield of the atomic oxygen resistant coating of $1\times10^{-24}$ $cm^3$ $atom^{-1}$ or less after exposure to an atomic oxygen fluence of $1.97\times10^{21}$ O atoms $cm^{-2}$.

18. The atomic oxygen resistant material of claim 13, wherein the atomic oxygen resistant coating is an atomic layer deposition coating deposited on the atomic oxygen resistant substrate.

\* \* \* \* \*